United States Patent [19]

Ono

[11] Patent Number: 5,407,486
[45] Date of Patent: Apr. 18, 1995

[54] CVD APPARATUS

[75] Inventor: Kenichi Ono, Hyogo, Japan

[73] Assignee: Mitsubishi Denki Kabushiki Kaisha, Tokyo, Japan

[21] Appl. No.: 60,547

[22] Filed: May 13, 1993

[30] Foreign Application Priority Data

May 14, 1992 [JP] Japan ................................. 4-148680

[51] Int. Cl.⁶ ............................................. C23C 16/00
[52] U.S. Cl. ..................................... 118/725; 118/728
[58] Field of Search ............... 219/618, 630, 634, 638, 219/672, 674; 118/724, 725, 728

[56] References Cited

U.S. PATENT DOCUMENTS

| | | | |
|---|---|---|---|
| 2,452,197 | 10/1948 | Kennedy | 219/674 |
| 3,689,726 | 9/1972 | Howell | 219/674 |
| 3,858,548 | 1/1975 | Tick | 118/724 |
| 4,711,989 | 12/1987 | Yu | 118/725 |
| 4,901,670 | 2/1990 | Ahlgren | 118/725 |
| 5,074,954 | 12/1991 | Nishizawa | 118/725 |

FOREIGN PATENT DOCUMENTS 63-89967  6/1988  Japan .
63-179075 7/1988  Japan .
2-197576  8/1990  Japan .
3-116028 12/1991  Japan .
4-127432  4/1992  Japan .

OTHER PUBLICATIONS

Bass et al, "Metal Organic Vapour Phase Epitaxy of Indium Phosphide", Journal of Crystal Growth, vol. 64, 1983, pp. 68-75.

Primary Examiner—Olik Chaudhuri
Assistant Examiner—Brian K. Dutton
Attorney, Agent, or Firm—Leydig, Voit & Mayer

[57] ABSTRACT

A CVD apparatus for growing a compound semiconductor film with a desired composition ratio on a wafer includes a heat source for supplying heat to a source gas flowing over the wafer so that a temperature gradient of the source gas is cancelled. The heat source may be a susceptor having a hollow part so that the heat capacity of the susceptor varies from the upstream part to the downstream part of the source gas flow. In this structure, the decomposition ratio of the source gas is uniform over the wafer surface whereby the uniformity of the composition distribution in the film grown on the wafer is improved, increasing production yield.

3 Claims, 4 Drawing Sheets

CVD APPARATUS

FIELD OF THE INVENTION

The present invention relates to a CVD (Chemical Vapor Deposition) apparatus that improves composition distribution in a crystal layer grown on a wafer in the apparatus.

BACKGROUND OF THE INVENTION

FIG. 6 is a schematic diagram illustrating a prior art MOCVD apparatus disclosed in "Metal Organic Vapor Phase Epitaxy of Indium Phosphide", Journal of Crystal Growth, 64 (1983), pp. 68-75. In FIG. 6, reference numeral 1 designates a reactor. A graphite susceptor 2 is contained in the reactor 1 and heated by a high-frequency induction heating coil 5 surrounding the reactor 1. A wafer 3 is disposed on the susceptor 2. Reference numeral 4 designates a source gas flow.

Source gases introduced into the reactor 1, such as trimethylindium (TMI), trimethylgallium (TMG), phosphine (PH$_3$), and arsine (AsH$_3$), are thermally decomposed in the presence of the induction heated susceptor 2 and elements of those gases are deposited on the wafer 3 on the susceptor 2.

FIG. 7 is a graph for explaining a distribution of composition in an InGaAsP crystal grown on a 3 inch diameter substrate. In FIG. 7, the ordinate shows the peak wavelength of photoluminescence which corresponds to the inverse of the band gap energy of the InGaAsP crystal, and the abscissa shows the mismatch rate of the lattice constant of the InGaAsP crystal to the lattice constant of the InP substrate. For example, when the lattice constant of the InP substrate is "a0" and the lattice constant of the InGaAsP crystal grown thereon is "a", the mismatch is represented by $$\frac{\Delta a}{a0} = \frac{a - a0}{a0}$$

In the graph, five points are plotted at intervals of 15 mm on the 3 inch diameter wafer from the upstream part to the downstream part of the gas flow. The five points are in a straight line on the graph. The gradient of the plot is the same as that attained when the growth is carried out while varying the flow rates of the V-group source gases, i.e., AsH$_3$ and PH$_3$. It is supposed, from this fact, that there is a difference in the incorporation ratios of the V-group atoms, i.e., As atoms and P atoms, in the wafer in the upstream and downstream parts of the source gas flow 4.

The cause of this phenomenon is as follows. The source gas 4 introduced into the reactor is heated on the susceptor 2 and deposited by the wafer 3. However, the temperature of the source gas at the upstream part of the gas flow does not reach a prescribed temperature (growth temperature) but the temperature gradually increases and approaches to the growth temperature while the source gas flows above the susceptor 2. Therefore, when the crystal growth process employs source gases whose decomposition ratios significantly vary depending on the temperature change in the vicinity of the growth temperature, the composition of the crystal grown on the wafer varies significantly from the upstream part to the downstream part of the source gas flow.

The above-described temperature gradient of the source gas 4 on the wafer 3 can be supposed from the doping efficiency of n type or p type impurities because the doping efficiency decreases with an increase in the temperature. That is, the doping efficiency at the downstream part is lower than that at the upper stream part of the gas flow.

In the conventional MOCVD apparatus, the temperature gradient of the source gas adversely affects the uniformity of the crystal composition in the wafer, so that the crystal composition of an end portion of the wafer positioned at the upstream part of the gas flow deviates from the standard value, reducing the yield in the crystal growth process.

Meanwhile, Japanese Published Utility Model Application No. 3-116028 discloses a CVD apparatus including a high frequency coil that is movable in the longitudinal direction of the reactor, whereby a region of a high heating efficiency produced by the high frequency coil is moved from one end to the opposite end of the wafer, reducing the variation in the temperature on the wafer. However, since the temperature gradient of the source gas flow is not reduced by the movable coil, the above-described problem remains unsolved. In this CVD apparatus, the surface of the susceptor, on which the wafer is put, is tilted to increase the gas velocity and decrease the unevenness of the thickness of the boundary layer due to the entrance effect, resulting in a uniform deposition speed over the wafer.

On the other hand, Japanese Published Patent Application No. 63-89967 discloses a CVD apparatus including resistance heating means and a high frequency induction coil which are divided into a plurality of parts in the longitudinal direction of the reactor. Since this CVD apparatus is for making the thickness of a single crystal layer grown on the wafer uniform, the above-described problem remains unsolved. More specifically, in this CVD apparatus, a temperature gradient, that provides a higher temperature at the downstream part of the gas flow and a lower temperature at the upstream part of the gas flow, is generated in the reactor to decrease the decomposition rate of the source gas at the upstream part and increase the deposition speed at the downstream part, resulting in a grown layer of having an even thickness. Therefore, the high frequency induction coil divided into a plurality of parts is used as auxiliary heating means for rapidly adjusting the temperature inside the reactor to the decomposition temperature of the source gas introduced into the reactor when the source gas is changed during the growth process. If a compound crystal is grown using this apparatus, the temperature gradient of the source gas on the wafer is further increased. Therefore, this CVD apparatus does not improve the composition distribution in the compound crystal grown on the wafer.

SUMMARY OF THE INVENTION

It is an object of the present invention to provide a CVD apparatus that improves the uniformity of the composition of a compound crystal grown on a wafer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a CVD apparatus includes means for supplying heat to the source gas flowing over the wafer so that the temperature gradient of the source gas is canceled. Therefore, the decomposition ratio of the source gas is uniform over the wafer surface, whereby the uniformity of the composition distribution of the crystal grown on the wafer is improved, increasing the production yield.

DETAILED DESCRIPTION OF THE PREFERRED EMBODIMENTS

Figure 1:
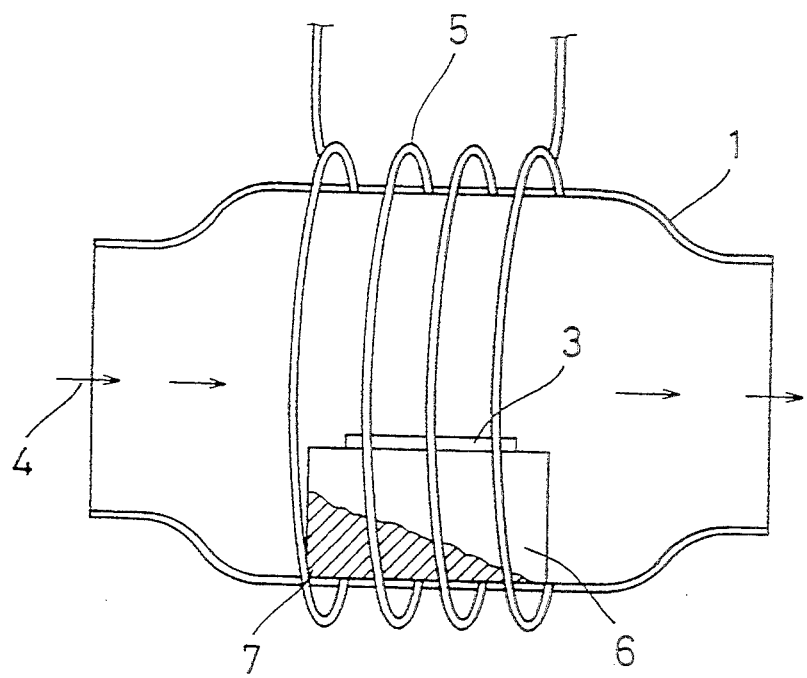
FIG. 1 is a schematic diagram illustrating an MOCVD apparatus in accordance with a first embodiment of the present invention.
Figure 2:
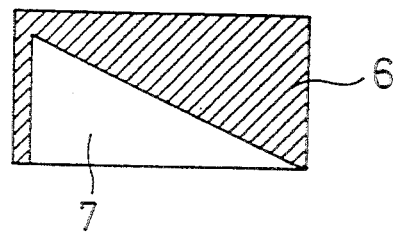
FIGS. 2(a) and 2(b) are a sectional view and a bottom plan view illustrating a susceptor employed in the apparatus of FIG. 1.
Figure 2:
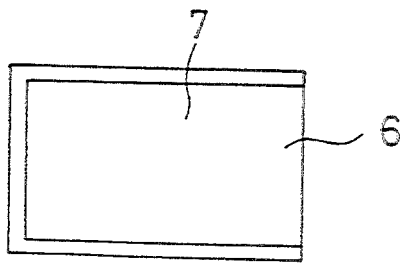
Figure 6:
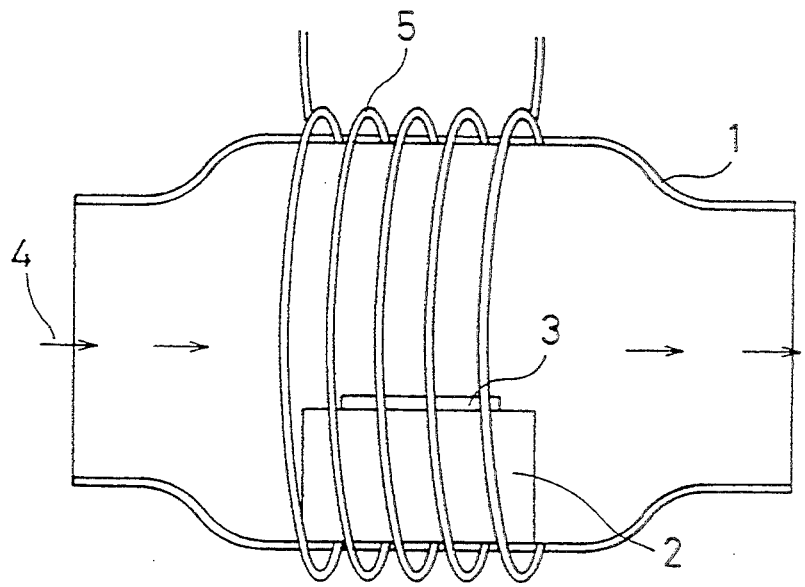
FIG. 6 is a schematic diagram illustrating prior art MOCVD apparatus.
Figure 7:
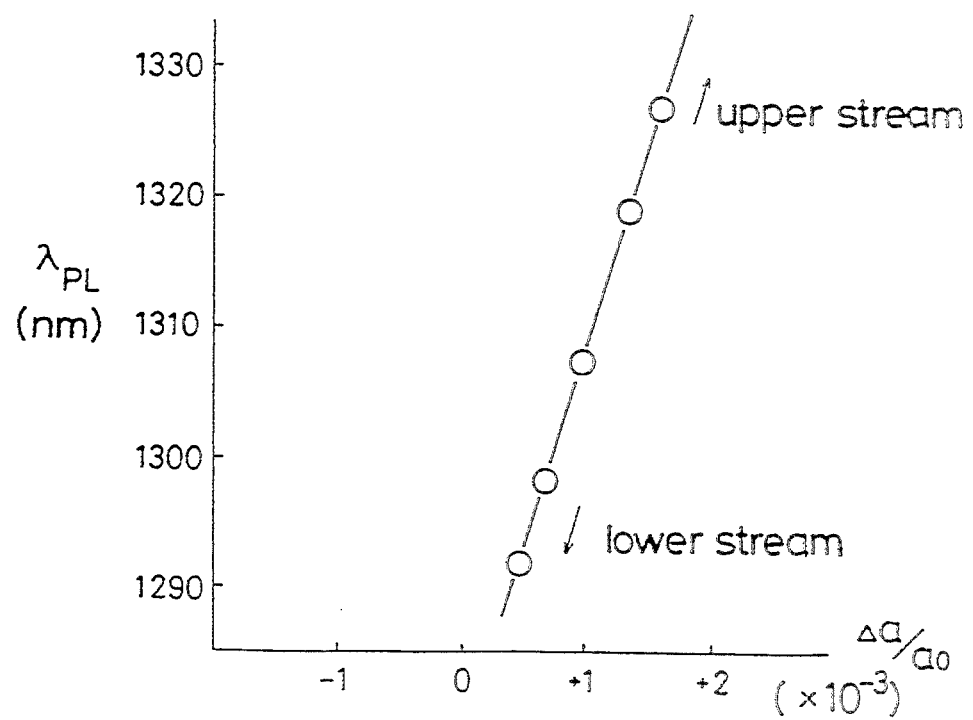
FIG. 7 is a graph for explaining a composition distribution in an InGaAs crystal grown on a wafer in the apparatus of FIG. 6.

FIG. 1 is a schematic diagram illustrating an MOCVD apparatus in accordance with a first embodiment of the present invention. In FIG. 1, the same reference numerals as in FIG. 6 designate the same or corresponding parts. Reference numeral 6 designates a susceptor having a hollow part 7. FIGS. 2(a) and 2(b) a sectional view and a bottom plan view of the susceptor 6.

A description is given of the MOCVD method using the apparatus of FIG. 1. In this first embodiment, since the susceptor 6, which is heated by the high frequency induction heating coil 5, has the hollow part 7, the volume, i.e., heat capacity, of the induction heated susceptor 6 increases from the upstream part to downstream part of the gas flow, whereby the susceptor 6 has a temperature gradient, i.e., the temperature of the susceptor gradually decreases in the downstream direction of the gas flow. When source gases, such as TMI, TMG, PH$_3$, and ASH$_3$, are introduced into the reactor 1 in the direction indicated by the source gas flow 4, the decomposition ratios of the source gases, particularly the decomposition ratios of PH$_3$ and AsH$_3$ which are easily varied by controlling the temperature, become uniform on the susceptor 6, whereby the uniformity of the composition of the crystal layer grown on the wafer is improved.

Figure 3:
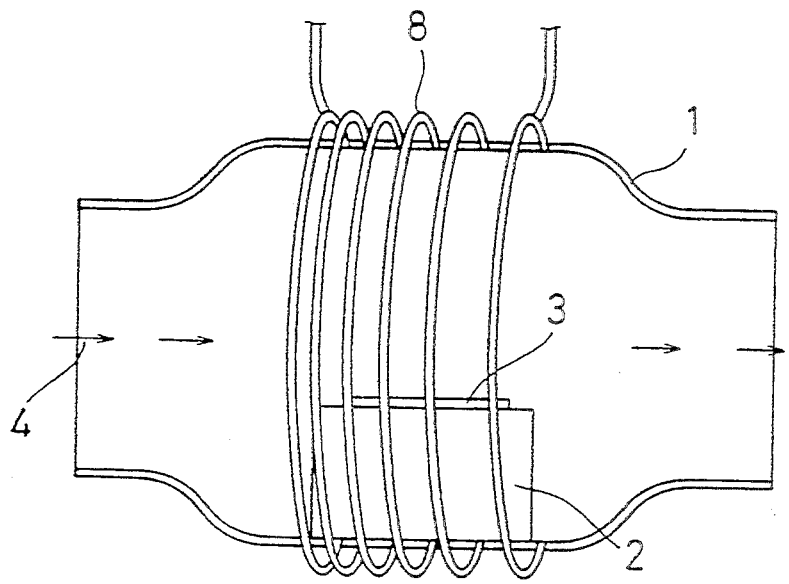
FIG. 3 is a schematic diagram illustrating an MOCVD apparatus in accordance with second embodiment of the present invention.

FIG. 3 is a schematic diagram illustrating an MOCVD apparatus in accordance with a second embodiment of the present invention. In this second embodiment, the density of the high frequency heating coil 8, i.e., the number of turns of the coil 8 per unit length along the axis of the coil is gradually decreased in the direction from the upstream part to the lowerstream part of the source gas flow, whereby the susceptor 2 has a temperature gradient.

According to the second embodiment of the present invention, since the susceptor 2 has a temperature gradient, i.e., the temperature of the susceptor 2 gradually decreases in the downstream direction of the source gas flow, the decomposition ratio of the source gas is uniform on the wafer between the upstream and the downstream parts of the gas flow, increasing the uniformity of the composition distribution of the crystal layer grown on the wafer.

Figure 4:
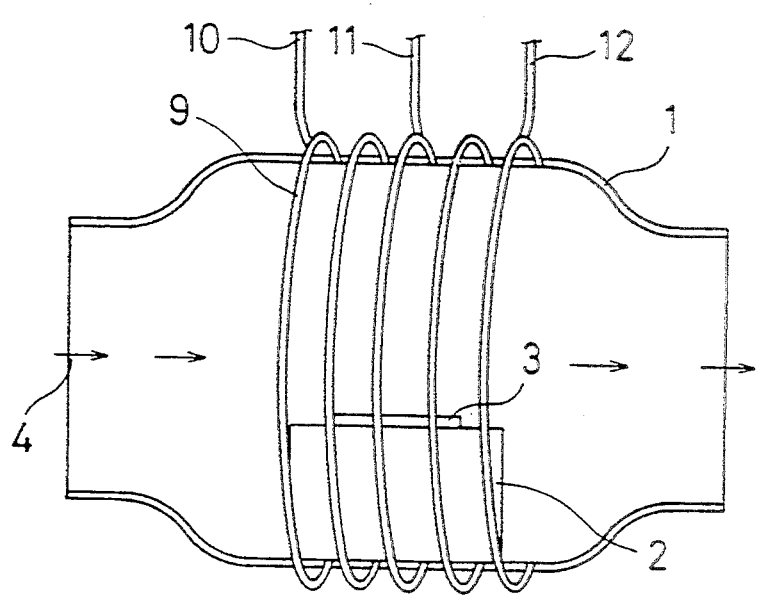
FIG. 4 is a schematic diagram illustrating an MOCVD apparatus in accordance with a third embodiment of the present invention.

FIG. 4 is a schematic diagram illustrating an MOCVD apparatus in accordance with a third embodiment of the present invention. In this third embodiment, the current flowing through the high frequency coil is varied in portions of the coil to generate a temperature gradient in the susceptor 2. More specifically, the high frequency heating coil 9 is provided with a current inlet wire 10 and current outlet wires 11 and 12. The current applied through the inlet wire 10 to the coil 9 branches into two through the outlet wires 11 and 12, whereby the voltage applied between the wires 10 and 11 is different from the voltage applied between the wires 10 and 12. In this way, the temperature of the susceptor 2 is controlled to generate a temperature gradient that provides higher temperature at the upstream side of the susceptor 2 and lower temperature at the downstream side of the susceptor 2.

According to the first to third embodiments of the present invention, since the susceptor has a temperature gradient that cancels the temperature gradient of the source gas flow 4, the decomposition ratio of the source gas 4 on a part of the susceptor at the upstream side is increased, improving the uniformity of the composition distribution in the crystal grown on the wafer 3.

Figure 5:
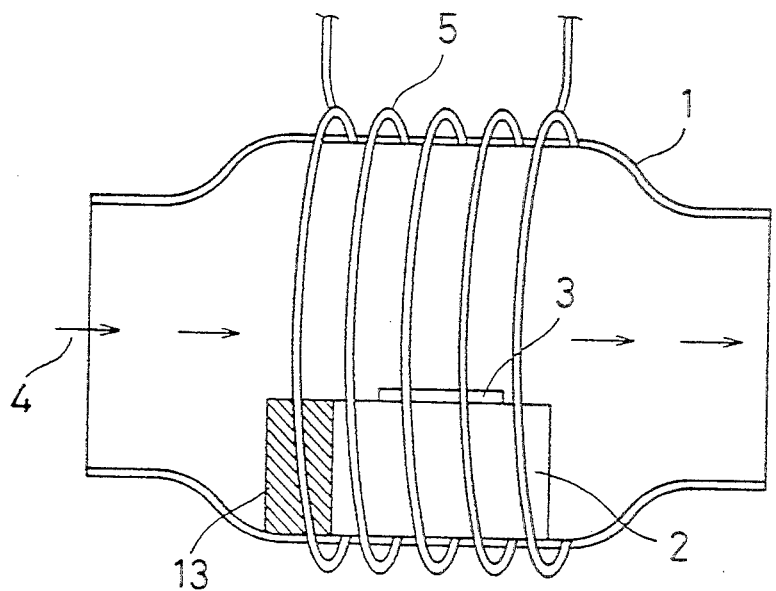
FIGS. 5(a) and 5(b) are schematic diagrams illustrating an MOCVD apparatus in accordance with a fourth embodiment of the present invention.
Figure 5:
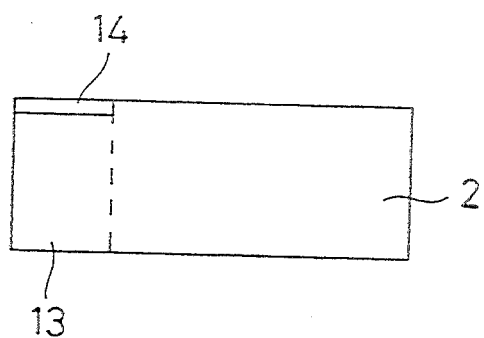

FIGS. 5(a) and 5(b) are schematic diagrams illustrating an MOCVD apparatus in accordance with a fourth embodiment of the present invention. In FIG. 5(a), an induction heated material 13 (preheating part) as large as or larger than the wafer 3 is attached to a side wall of the susceptor 2 at the upstream side. Preferably, the preheating part 13 has a heat capacity as large as or larger than that of the susceptor 2.

In this structure, since a part of the source gas 4 having a large temperature gradient is present above the preheating part 13 on which the wafer 3 is absent, the source gas 4 with a smaller temperature gradient is applied to the wafer 3, increasing the uniformity of the composition distribution in the crystal grown on the wafer. Since the reaction product is deposited on the preheating part 13 during the crystal growth, a detachable plate comprising quartz or the like is disposed on the preheating part 13 as shown in FIG. 5(b) and the reaction product on the detachable plate 14 is washed away after each growth.

While in the above-described first to fourth embodiments InGaAsP is grown on the InP substrate, the MOCVD apparatus of the present invention may be employed for the growth of other compound semiconductors with the same effects as described above.

While in the above-described first to fourth embodiments the horizontal type MOCVD apparatus is employed, the present invention may be applied to a barrel type MOCVD apparatus. In addition, the present invention may be applied to apparatus other than the MOCVD apparatus as it utilizes thermal decomposition.

What is claimed is:

1. A CVD apparatus for growing a compound semiconductor film with a desired composition ratio on a wafer including:
a reactor;
a susceptor disposed within the reactor for heating with a high frequency current; and
an inlet in the reactor for supplying source gases to the susceptor from an upstream end of the reactor and an outlet in the reactor at a downstream end of the reactor for exhausting the source gases from the reactor wherein the susceptor has an upstream end oriented toward the upstream end of the reactor, a downstream end oriented toward the downstream of the reactor, and a hollow part having a cross-sectional area transverse to the flow of the source gases, the cross-sectional area of the hollow part decreasing from the upstream end of the susceptor to the downstream end of the susceptor.

2. A CVD apparatus for growing a compound semiconductor film with a desired composition ratio on a wafer including:
a reactor;
a susceptor disposed within the reactor for heating with a high frequency current;
an inlet in the reactor for supplying source gases to the susceptor from an upstream end of the reactor and an outlet in the reactor at a downstream end of the reactor for exhausting the source gases from the reactor; and
means for supplying heat to the susceptor so that a temperature gradient caused by flow of the source gases over the susceptor is cancelled wherein said means for supplying heat includes an induction heated material disposed adjacent the susceptor and oriented toward the upstream end of the reactor.

3. The apparatus of claim 2 including a detachable cover disposed on said induction heated material.

* * * * *